United States Patent
Hou et al.

(10) Patent No.: US 10,333,066 B2
(45) Date of Patent: Jun. 25, 2019

(54) PIXEL DEFINITION LAYER AND MANUFACTURING METHOD THEREOF, DISPLAY SUBSTRATE AND DISPLAY DEVICE

(71) Applicant: BOE TECHNOLOGY GROUP CO., LTD., Beijing (CN)

(72) Inventors: Wenjun Hou, Beijing (CN); Ze Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 1023 days.

(21) Appl. No.: 14/345,622

(22) PCT Filed: Dec. 9, 2013

(86) PCT No.: PCT/CN2013/088832
§ 371 (c)(1),
(2) Date: Mar. 18, 2014

(87) PCT Pub. No.: WO2014/206016
PCT Pub. Date: Dec. 31, 2014

(65) Prior Publication Data
US 2015/0004375 A1    Jan. 1, 2015

(30) Foreign Application Priority Data
Jun. 28, 2013   (CN) .......................... 2013 1 0268023

(51) Int. Cl.
*H01L 51/56*   (2006.01)
*H01L 51/00*   (2006.01)
(Continued)

(52) U.S. Cl.
CPC ...... *H01L 51/0014* (2013.01); *H01L 27/3246* (2013.01); *H01L 51/56* (2013.01);
(Continued)

(58) Field of Classification Search
CPC ............. H01L 27/3246; H01L 51/0014; H01L 51/0005; H01L 27/32–3297; H01L 51/50–5296; H01L 51/56; H01L 2251/56
See application file for complete search history.

(56) References Cited

U.S. PATENT DOCUMENTS 7,015,501 B2   3/2006   Redecker et al.
7,817,238 B2   10/2010   Lee et al.
(Continued)

FOREIGN PATENT DOCUMENTS

CN   1496198 A   5/2004
CN   1523381     8/2004
(Continued)

OTHER PUBLICATIONS

Machine translation of CN103066004B.*
(Continued)

*Primary Examiner* — Lauren R Bell
(74) *Attorney, Agent, or Firm* — Collard & Roe, P.C.

(57) ABSTRACT

A pixel circuit, driving method thereof, organic light-emitting display panel and display apparatus, comprise driving transistor, first storage capacitor, collecting unit, writing unit and light-emitting unit; the collecting unit is used for collecting the threshold voltage of the driving transistor and storing the threshold voltage into the first storage capacitor, under the control of the first scan signal; the writing unit is used for storing the data voltage inputted from the input terminal for the data voltage under the control of the second scan signal; and the light-emitting unit is used for emitting lights, driven by the data voltage and a voltage inputted from the input terminal for the controllable low voltage, under the control of the light-emitting control signal. Thus, the organic light-emitting device is not affected by the threshold voltage shift of the driving transistor, which may enhance the image
(Continued)

uniformity of the organic light-emitting display panel effectively.

10 Claims, 2 Drawing Sheets

(51) Int. Cl.
 *H01L 27/32* (2006.01)
 *H05K 3/18* (2006.01)
(52) U.S. Cl.
 CPC .......... *H05K 3/185* (2013.01); *H01L 51/0005* (2013.01); *H05K 2203/0709* (2013.01)

(56) References Cited

U.S. PATENT DOCUMENTS

| | | | |
|---|---|---|---|
| 2006/0220542 A1* | 10/2006 | Suh | G02F 1/136286 313/506 |
| 2007/0172979 A1 | 7/2007 | Uchino et al. | |
| 2009/0284146 A1 | 11/2009 | Yoshida et al. | |
| 2010/0183854 A1 | 7/2010 | Masuda et al. | |
| 2010/0193817 A1* | 8/2010 | Amamiya | H01L 27/3246 257/98 |
| 2014/0141564 A1 | 5/2014 | Wang et al. | |

FOREIGN PATENT DOCUMENTS

| | | |
|---|---|---|
| CN | 1834745 | 9/2006 |
| CN | 101543135 A | 9/2009 |
| CN | 103066004 | 4/2013 |
| CN | 103346123 | 10/2013 |
| CN | 103367391 | 10/2013 |
| JP | 2005235569 A | 9/2005 |

OTHER PUBLICATIONS

English Translation of the International Search Report of PCT/CN2013/088832 published in English dated Dec. 31, 2014.

International Search Report, International Preliminary Report on Patentability and Written Opinion of the International Searching Authority of PCT/CN2013/088832 in Chinese, dated Mar. 23, 2014.
Chinese Office Action of Chinese Application No. 201310268023.6 with English translation, dated Sep. 19, 2014.

English translation of the International Preliminary Report on Patentability and Written Opinion of the International Searching Authority of PCT/CN2013/088832, dated Dec. 29, 2015.

* cited by examiner ures to prepare plane function materials, for example, prepare a polymer conductive film, a color organic light emitting diode, a thin-film semiconductor device and the like.
However, when the ink-jet printing technology is applied to a display device, such as a liquid crystal display device or an Organic Light Emitting Diode (OLED) display device and the like, the printed ink may overflow into an adjacent pixel region from the concerned pixel region because of fluidity of the ink. In order to prevent the printed ink from overflowing into the adjacent pixel region, a pixel definition layer is generally provided. The pixel definition layer comprises a pixel division wall formed at the non-pixel region between the pixel regions so as to form a space surrounded by the pixel division walls; and the ink is applied within the space by the ink-jet printing method.
Generally, the pixel definition layer is manufactured by the following method. Firstly, an organic insulating film is formed on a substrate; and then a solvent is spray-coated on the organic insulating film to form the pixel division walls by using the "coffee-ring" effect. In the above method, the organic insulating film is firstly prepared by a spin coating method or a blade coating method, and then the organic insulating material of the organic insulating film migrates due to the solvent so as to form the pixel division wall. However, the above method has the following disadvantages: on the one hand, in the case that the organic insulating film is prepared by the above-mentioned spin coating method or blade coating method, the utilization ratio of the organic insulating material for forming the organic insulating film is low; on the other hand, when the organic insulating material of the organic insulating film migrates due to the solvent to form the pixel division wall, the organic insulating material may migrate incompletely so that additional processes such as a plasma etching process and the like are further required, in this case, the manufacturing method of the pixel definition layer is complex and the production line has a low efficiency.

PIXEL DEFINITION LAYER AND MANUFACTURING METHOD THEREOF, DISPLAY SUBSTRATE AND DISPLAY DEVICE

CROSS REFERENCE TO RELATED APPLICATIONS

This application is the National Stage of PCT/CN2013/088832 filed on Dec. 9, 2013, which claims priority under 35 U.S.C. § 119 of Chinese Application No. 201310268023.6 filed on Jun. 28, 2013, the disclosure of which is incorporated by reference. The international application under PCT article 21(2) was not published in English.

TECHNICAL FIELD

Embodiments of the invention relate to a pixel definition layer and a manufacturing method thereof, a display substrate and a display device.

BACKGROUND

Ink-jet printing technology is one of the main technologies adopted in the modern office printing. In recent years, researchers have attempted to apply the ink-jet printing technology to prepare plane function materials, for example,

SUMMARY

An embodiment of the invention provides a manufacturing method for a pixel definition layer. The method comprises: performing a surface treatment on a substrate; and forming a pixel definition layer on the substrate by ink-jet printing, wherein the pixel definition layer comprises a pixel division wall.

For example, the substrate comprises a pixel region and a non-pixel region; the surface treatment is performed on the substrate so that a surface energy of the pixel region is different from that of the non-pixel region; and the pixel division wall is formed in the non-pixel region.

For example, a difference between a contact angle of a droplet formed by the ink-jet printing in the pixel region of the substrate and a contact angle of a droplet formed by the ink-jet printing in the non-pixel region of the substrate is 30° or more.

For example, the surface treatment is performed on the substrate so that the surface energy of the pixel region is different from that of the non-pixel region comprises: performing a self-assembled monomolecular layer surface treatment on the substrate to form a monomolecular layer in the pixel region of the substrate.

For example, the performing the self-assembled monomolecular layer surface treatment on the substrate to form the monomolecular layer in the pixel region of the substrate comprises: performing the self-assembled monomolecular layer surface treatment on the substrate to form the monomolecular layer on a surface of the substrate; and removing the monomolecular layer in the non-pixel region.

For example, the performing the self-assembled monomolecular layer surface treatment on the substrate to form the monomolecular layer in the pixel region of the substrate comprises: shielding the non-pixel region by a mask plate, and performing the self-assembled monomolecular layer surface treatment on the substrate to form the monomolecular layer on a surface of the substrate.

For example, the performing the self-assembled monomolecular layer surface treatment on the substrate to form the monomolecular layer in the pixel region of the substrate comprises: performing the surface treatment on the substrate by using silicon fluoride in an inert gas atmosphere to form a silicon fluoride monomolecular layer on the surface of the substrate; and performing an ultraviolet irradiation treatment on the non-pixel region of the substrate by using a mask plate so as to remove the silicon fluoride monomolecular layer in the non-pixel region.

For example, after forming the pixel division wall in the non-pixel region by the ink-jet printing, the method further comprises: removing the monomolecular layer in the pixel region.

For example, after forming the pixel division wall in the non-pixel region of the substrate by the ink-jet printing, the method further comprises: removing the silicon fluoride monomolecular layer in the pixel region.

For example, the removing the silicon fluoride monomolecular layer in the pixel region comprises: performing an ultraviolet irradiation treatment at least on the pixel region.

For example, the forming the pixel definition layer on the substrate by the ink-jet printing comprises: printing an ink for forming the pixel division wall in the non-pixel region by the ink-jet printing; and performing a curing treatment on the ink printed in the non-pixel region.

For example, the ink for forming the pixel division wall is a solution formed by mixing a solute of organic insulating material and an organic solvent.

For example, the curing treatment is an annealing treatment or a drying treatment.

For example, the non-pixel region is provided between adjacent pixel regions.

An embodiment of the invention provides a pixel definition layer, which is manufactured by the manufacturing method according to the embodiment of the invention.

An embodiment of the invention provides a display substrate, which comprises the pixel definition layer according to the embodiment of the invention.

An embodiment of the invention provides a display device, which comprises the display substrate according to the embodiment of the invention.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

The embodiments of the invention provide a pixel definition layer and a manufacturing method thereof, a display substrate and a display device. The pixel definition layer comprises a pixel division wall; and the pixel definition layer is formed by the method according to an embodiment of the invention. The display substrate comprises the pixel definition layer formed by the method according to the embodiment of the invention. The display device comprises the display substrate according to an embodiment of the invention. It should be noted that the display device may be a display device, such as a liquid crystal display, an e-paper, an OLED display, a Polymer Light-Emitting Diode (PLED) display and the like, or may be any product or component with display function, such as a television, a digital camera, a mobile phone, a tablet PC and the like comprising the above display device.

It should be noted that "layer" in the embodiments of the invention refers to a layer of thin film prepared with certain material on a substrate by using deposition or other process and comprising a "pattern". For example, in the embodiments of the invention, the pixel definition layer may be a layer of thin film formed, for example, by ink-jet printing and comprising a pattern of the pixel division wall. During the ink-jet printing process, the ink-jet printing is carried out in a desired region. Because of the fluidity of the ink-jet printed ink, the ink-jet printed ink may overflow into other regions adjacent to the desired region, and in this case, the pixel division wall is needed to be formed around the desired region for ink-jet printing to prevent overflow of the ink-jet printed ink.

Figure 1:
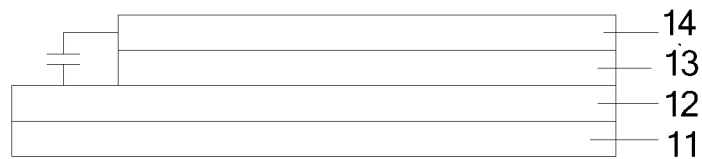
FIG. 1 is a structural schematic view illustrating an OLED device.
Figure 2:
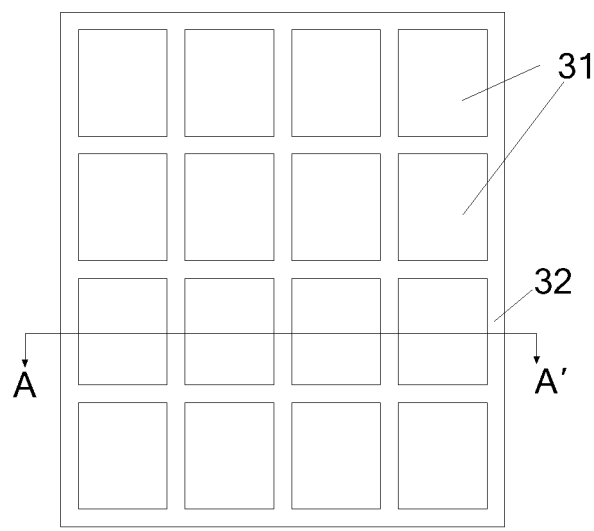
FIG. 2 is a top view illustrating a substrate according to an embodiment of the invention.
Figure 3:
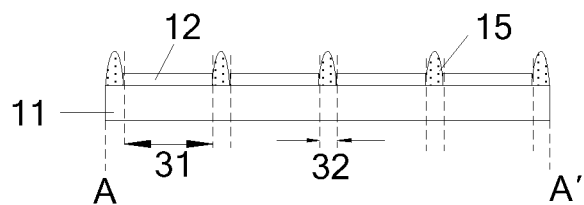
FIG. 3 is a sectional view illustrating a pixel definition layer according to an embodiment of the invention.

For example, the pixel definition layer and the manufacturing method thereof may be used for an OLED display device. As shown in FIG. 1, an OLED generally comprises an anode electrode layer 12, a light emitting functional layer 13 and a cathode electrode layer 14 which are successively provided on a base substrate 11. The display device comprises a pixel region 31 and non-pixel region 32, as shown in FIG. 2. The light emitting functional layer may be formed on the anode electrode layer 12 within the pixel region 31 by ink-jet printing; however, because of the fluidity of the ink-jet printed ink, the ink-jet printed ink may overflow into an adjacent pixel region. As shown in FIG. 3, the pixel definition layer according to the embodiment of the invention comprises the pixel division wall 15 provided between pixel regions 31 (namely, provided in the non-pixel region 32) so as to form an accommodation space; and ink-jet printed ink for forming the light emitting functional layer is applied within the accommodation spaces by ink-jet printing. Because of the blocking effect of the pixel division wall, the ink-jet printed ink for forming the light emitting functional layer will not overflow into the adjacent pixel region. It should be noted that the light emitting functional layer may comprise a hole injection layer, a hole transmission layer, an electroluminescence layer, etc.; and each of these layers may be formed by ink-jet printing.

It should be noted that the pixel definition layer and the manufacturing method thereof may be used for forming other display devices and other structures. For example, in the case that a color filter layer of a liquid crystal display device is formed, the pixel definition layer is formed on the substrate before forming the color filter layer, and then color filter layers of red, green and blue are respectively formed within the accommodation spaces surrounded by the pixel division walls of the pixel definition layer by ink-jet printing. Accordingly, the purity of each color of red, green and blue can be ensured. The embodiment of the invention does not limit the type of the display device and the structure employing the pixel definition layer.

The manufacturing method of the pixel definition layer will be explained in detail below in conjunction with the accompanying drawings.

An embodiment of the invention provides a manufacturing method of a pixel definition layer. The method comprises:

Step 101: performing a surface treatment on a substrate.

As shown in FIG. 2, the substrate comprises a pixel region 31 and a non-pixel region 32. There are multiple pixel regions 31. For example, one pixel region 31 corresponds to a pixel unit of one color, such as a red, green or blue pixel unit. The non-pixel region 32 is provided between adjacent pixel regions 31.

The surface treatment is performed on the substrate so that a surface energy of the pixel region of the substrate is different from that of the non-pixel region of the substrate.

The substrate in the embodiment of the invention is the substrate before the pixel definition layer is formed, which may be a base substrate or a structure obtained by forming a plurality of thin films or layers on the base substrate. The base substrate may be made of glass, silicon, quartz, etc. For example, as shown in FIG. 3, the substrate comprises a base substrate 11 and an anode electrode layer 12 formed on the base substrate 11. As an example, the following description is given based on the case that the substrate comprises the base substrate 11 and the anode electrode layer 12 formed on the base substrate 11.

Step 102: forming a pixel definition layer on the substrate by ink-jet printing, wherein the pixel definition layer comprises a pixel division wall.

The pixel division wall is formed in the non-pixel region. Since the surface energy of the pixel region is different from that of the non-pixel region, the pixel division wall is formed in the non-pixel region rather than in the pixel region.

Figure 4:
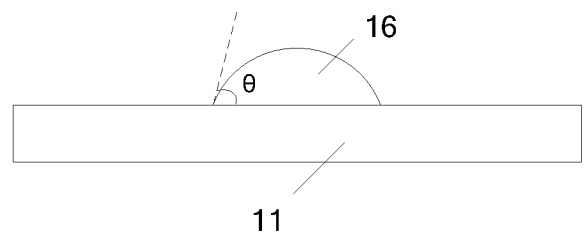
FIG. 4 is a schematic view illustrating a contact angle formed between a substrate and a droplet on the substrate.

It should be noted that, the surface energy of the substrate is a sum of a dispersion component and a polarity component of the surface of the substrate; the amount and polarity of the surface energy of the substrate may be obtained by measuring a contact angle with a measure apparatus; and the contact angle refers to an angle formed between the tangent line of the gas-liquid interface that passes through the liquid and the solid-liquid interface at the intersection of three-phases of gas, liquid and solid. As shown in FIG. 4, a droplet 16 is printed on the base substrate 11, having the contact angle of θ. If θ<90°, the surface of the base substrate 11 is hydrophilic, namely, the liquid can wet the base substrate 11 easily, and the smaller the contact angle is, the better the wettability is. If θ>90°, the surface of the base substrate 11 is hydrophobic, namely, the liquid cannot wet the surface of the base substrate 11 easily and tends to move on the surface. If θ=90°, it is the critical value whether the liquid wet the surface of the base substrate 11 or not. It should be noted that the hydrophilicity and hydrophobicity are relative. If the substrate has regions of different surface energies, relatively speaking, one of the regions is hydrophilic and the other is hydrophobic. The greater the difference between the contact angles of different regions of the substrate is, the greater the difference of the surface energies of different regions of the substrate is. For example, in the embodiment of the invention, the difference between the contact angle of the ink-jet printed droplet in the pixel region of the substrate and the contact angle of the ink-jet printed droplet in the non-pixel region of the substrate is 30° or more. However, it should be noted that the embodiment of the invention does not limit the difference between the contact angle of the ink-jet printed droplet in the pixel region of the substrate and the contact angle of the ink-jet printed droplet in the non-pixel region of the substrate as long as this difference of contact angles (in other words, difference of surface energies) enables the pixel division wall to be formed in the non-pixel region rather than in the pixel region. It should be noted that the droplet for measuring the contact angle generally is water, or the droplet may be any other solution. In the embodiment of the invention, the droplet may be ink-jet printed ink, namely, ink-jet printing solution for forming the pixel definition layer.

The surface treatment may be performed on the substrate by various methods, such as self-assembled monomolecular layer surface treatment, ultraviolet ozone cleaning treatment, self-assembled polymolecular layer surface treatment, film deposition, etc. The self-assembled monomolecular layer surface treatment comprises a wet liquid self-assembled monomolecular layer surface treatment and a dry vapor self-assembled monomolecular layer surface treatment. The substrate may be processed by the suitable method selected according to the practical demands.

It should be noted that a flexible substrate has a high requirement on the processing temperature. The manufacturing method according to the embodiment of the invention can be used for the flexible substrate for it does not need a high processing temperature. For example, the flexible substrate may be made of PET (polyethylene terephthalate), PI (polyimide), etc.

For example, the surface treatment is performed on the substrate so that the surface energy of the pixel region of the substrate is different from that of the non-pixel region of the substrate comprises: performing the self-assembled monomolecular layer surface treatment on the substrate to form a monomolecular layer in the pixel region of the substrate.

For example, the performing the self-assembled monomolecular layer surface treatment on the substrate to form the monomolecular layer in the pixel region of the substrate may be: merely forming the monomolecular layer in the pixel region of the substrate. In this case, for example, the non-pixel region of the substrate is shielded by certain component (such as a mask plate), so that the monomolecular layer is merely formed in the pixel region. Alternatively, the performing the self-assembled monomolecular layer surface treatment on the substrate to form the monomolecular layer in the pixel region of the substrate may be: performing the self-assembled monomolecular layer surface treatment on the substrate to form the monomolecular layer on the substrate; and removing the monomolecular layer in the non-pixel region.

In the case of performing the self-assembled monomolecular layer surface treatment on the substrate to form the monomolecular layer in the pixel region of the substrate, after the pixel definition layer comprising the pixel division wall is formed on the substrate by the ink-jet printing, the manufacturing method of the pixel definition layer may further comprise: removing the monomolecular layer in the pixel region. The monomolecular layer in the pixel region is not favorable to apply the desired material (such as the light emitting layer material) in the space surrounded by the pixel division walls, thus the monomolecular layer in the pixel region is removed after the pixel definition layer comprising the pixel division wall is formed.

The manufacturing method of the pixel definition layer according to the embodiment of the invention will be described in detail below by taking the self-assembled silicon fluoride monomolecular layer surface treatment as an example. For example, the manufacturing method of the pixel definition layer according to the embodiment of the invention comprises:

Step 201: performing the surface treatment on the substrate by using silicon fluoride in an inert gas atmosphere to form a silicon fluoride monomolecular layer on the surface of the substrate.

Figure 5:
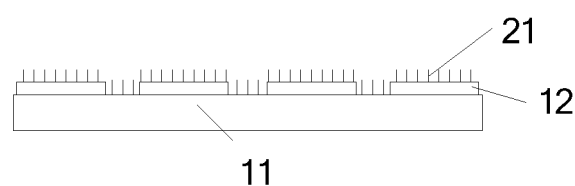
FIG. 5 is a schematic view illustrating that a silicon fluoride monomolecular layer is formed on a surface of a substrate.

As shown in FIG. 5, the silicon fluoride monomolecular layer 21 is formed on the surface of the substrate; and the substrate comprises the base substrate 11 and the anode electrode layer 12 provided on the base substrate 11. For example, the silicon fluoride monomolecular layer 21 is formed on the surface of the substrate by the dry vapor self-assembled monomolecular layer surface treatment method; in this case, for example, the steam of silicon fluoride is used to process the substrate to form the silicon fluoride monomolecular layer 21 on the surface of the substrate. Alternatively, the silicon fluoride monomolecular layer 21 is formed on the surface of the substrate by the wet liquid self-assembled monomolecular layer surface treatment method; in this case, for example, the substrate is immerged in the silicon fluoride liquid to form the silicon fluoride monomolecular layer 21 on the surface of the substrate.

Step 202: performing an ultraviolet irradiation treatment on the non-pixel region of the substrate by using the mask plate so as to remove the silicon fluoride monomolecular layer in the non-pixel region.

Figure 6:
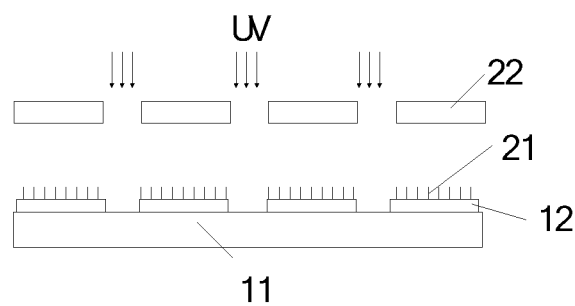
FIG. 6 is a schematic view illustrating performing a ultraviolet irradiation treatment on the substrate formed with the silicon fluoride monomolecular layer by using a mask plate.

As shown in FIG. 6, the mask plate 22 comprises a light transmittance region and an opaque region; the opaque region of the mask plate covers the pixel region of the substrate; the ultraviolet light irradiates on the substrate through the light transmittance region of the mask plate so as to remove the silicon fluoride monomolecular layer 21 in the non-pixel region. It should be noted that the ultraviolet irradiation treatment is typically carried out by an ultraviolet ozone cleaner; in this case, the oxygen in the air is decomposed by the light energy of ultraviolet light to generate ozone and the ozone can affect the silicon fluoride monomolecular layer 21 on the substrate. When the substrate is subjected to the ultraviolet irradiation treatment, the mask plate is preferably close to the substrate so as to ensure that only the silicon fluoride monomolecular layer 21 in the non-pixel region is removed by the ultraviolet irradiation treatment without removing the silicon fluoride monomolecular layer 21 in the pixel region.

Step 203: forming the pixel division wall in the non-pixel region of the substrate by the ink-jet printing.

Figure 7:
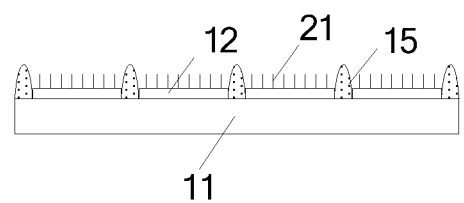
FIG. 7 is a schematic view illustrating a pixel division wall formed at a non-pixel region on the substrate.

As shown in FIG. 7, the pixel division wall 15 is formed in the non-pixel region of the substrate by the ink-jet printing.

Step 204: removing the silicon fluoride monomolecular layer in the pixel region.

For example, the ultraviolet irradiation treatment is performed at least on the pixel region to remove the silicon fluoride monomolecular layer 21 in the pixel region and further obtain the structure shown in FIG. 3. For example, the ultraviolet irradiation treatment is performed merely on the pixel region by using the mask plate, so that the silicon fluoride monomolecular layer 21 in the pixel region is removed. Of course, if the ultraviolet irradiation treatment has no influence on the pixel division wall and other thin film or layer structure that have been formed on the substrate, the whole substrate can be subjected to the ultraviolet irradiation treatment so as to remove the silicon fluoride monomolecular layer 21 in the pixel region.

For example, in the above step 102 or step 203, the forming the pixel definition layer comprising the pixel division wall on the substrate by the ink-jet printing comprises:

Step 1021: printing an ink for forming the pixel division wall in the non-pixel region by the ink-jet printing.

The ink for forming the pixel division wall may be a solution of organic insulating material or a solution formed by mixing a solute of organic insulating material and an organic solvent. For example, the organic insulating material may be: polyhexafluoropropylene, fluorinated parylene, fluorinated poly siliconether, fluorinated polyimide, fluorinated polyamide, polyimide, polysiloxane, polymethyl methacrylate, polybutyl methacrylate, polycyclohexyl methacrylate, polystyrene, etc. For example, the organic solvent may be tetrahydronaphthalene, perfluoroalkane, etc.

Step 1022: performing a curing treatment on the ink printed in the non-pixel region.

It should be noted that the ink-jet printed ink may be cured by different methods according to the composition of the ink-jet printed ink. When the ink-jet printed ink is the solution of organic insulating material, the solution of organic insulating material is subjected to annealing or drying treatment to remove the solvent in the solution of organic insulating material and cure the organic insulating material. It should be noted that all organic insulating materials in the embodiment of the invention are macromolecule materials and the solvent is a small-molecule solvent; and the solution of the organic insulating material and the solvent forms the pixel definition layer comprising the pixel division wall on the substrate by the ink-jet printing. In the embodiment of the invention, the solution of the organic insulating material is subjected to annealing treatment to remove the small-molecule solvent in the solution of organic insulating material; and the pixel definition layer comprising the pixel division wall on the substrate is formed of macromolecule organic insulating material.

The foregoing embodiments merely are exemplary embodiments of the invention, and not intended to define the scope of the invention, and the scope of the invention is determined by the appended claims.

What is claimed is:

1. A manufacturing method of a pixel definition layer, the pixel definition layer comprising a pixel division wall, wherein
   the method comprises: performing a surface treatment on a surface of a substrate, the substrate comprises a pixel region and a non-pixel region, and forming the pixel division wall in the non-pixel region of the substrate by ink-jet printing after the performing the surface treatment on the surface of the substrate; and
   the performing the surface treatment on the surface of the substrate comprises:
   using silicon fluoride in an inert gas atmosphere to form a silicon fluoride monomolecular layer on the surface of the substrate, and
   performing an ultraviolet irradiation treatment on the non-pixel region of the substrate by using a mask plate so as to not remove the silicon fluoride monomolecular layer in the pixel region and remove the silicon fluoride monomolecular layer in the non-pixel region.

2. The manufacturing method according to claim 1, wherein a difference between a contact angle of a droplet formed by the ink-jet printing in the pixel region of the substrate and a contact angle of a droplet formed by the ink-jet printing in the non-pixel region of the substrate is 30° or more.

3. The manufacturing method according to claim 1, wherein the method further comprises:
   after forming the pixel division wall in the non-pixel region of the substrate by the ink-jet printing, removing the silicon fluoride monomolecular layer in the pixel region.

4. The manufacturing method according to claim 3, wherein the removing the silicon fluoride monomolecular layer in the pixel region comprises:
   performing a second ultraviolet irradiation treatment at least on the pixel region.

5. The manufacturing method according to claim 1, wherein the forming the pixel division wall in the non-pixel region of the substrate by ink-jet printing comprises:
   printing an ink for forming the pixel division wall in the non-pixel region by the ink-jet printing; and
   performing a curing treatment on the ink printed in the non-pixel region.

6. The manufacturing method according to claim 5, wherein the ink for forming the pixel division wall is a solution formed by mixing a solute of organic insulating material and an organic solvent.

7. The manufacturing method according to claim 6, wherein the curing treatment is an annealing treatment or a drying treatment.

8. The manufacturing method according to claim 5, wherein the curing treatment is an annealing treatment or a drying treatment.

9. The manufacturing method according to claim 1, wherein the substrate comprises a plurality of the pixel regions, and the non-pixel region is provided between adjacent pixel regions among the plurality of the pixel regions.

10. A manufacturing method of a pixel definition layer, the pixel definition layer comprising a pixel division wall, wherein the method comprises: performing a surface treatment on a surface of a substrate, the substrate comprises a pixel region and a non-pixel region, and forming the pixel division wall in the non-pixel region of the substrate by ink-jet printing after the performing the surface treatment on the surface of the substrate;

the performing the surface treatment on the surface of the substrate comprises performing a self-assembled monomolecular layer surface treatment on the surface of the substrate to form a monomolecular layer in the pixel region of the substrate; and after forming the pixel division wall in the non-pixel region of the substrate by the ink-jet printing, the method further comprises removing the monomolecular layer in the pixel region.

* * * * *